(12) United States Patent
Ito et al.

(10) Patent No.: US 7,301,979 B2
(45) Date of Patent: Nov. 27, 2007

(54) SEMICONDUCTOR LASER

(75) Inventors: Keiji Ito, Takatsuki (JP); Isao Kidoguchi, Kawanishi (JP); Toru Takayama, Nara (JP); Osamu Imafuji, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 246 days.

(21) Appl. No.: 10/825,407

(22) Filed: Apr. 14, 2004

(65) Prior Publication Data

US 2004/0233957 A1 Nov. 25, 2004

(30) Foreign Application Priority Data

May 22, 2003 (JP) ............................... 2003-144481

(51) Int. Cl.
*H01S 5/00* (2006.01)

(52) U.S. Cl. .................................................. 372/46.01

(58) Field of Classification Search .............. 372/46.01
See application file for complete search history.

(56) References Cited

U.S. PATENT DOCUMENTS

| | | | | |
|---|---|---|---|---|
| 6,055,256 | A * | 4/2000 | Nakatsuka et al. | 372/46.01 |
| 6,075,801 | A * | 6/2000 | Tamanuki et al. | 372/46.01 |
| 6,104,738 | A * | 8/2000 | Kitoh et al. | 372/46.01 |
| RE37,051 | E | 2/2001 | Welch et al. | |
| 6,219,366 | B1 * | 4/2001 | Furushima | 372/50.1 |
| 6,301,283 | B1 * | 10/2001 | Chen et al. | 372/96 |
| 6,307,873 | B1 * | 10/2001 | Geels et al. | 372/46.01 |
| 6,404,790 | B1 * | 6/2002 | Narui et al. | 372/43.01 |
| 6,459,840 | B1 | 10/2002 | Sato et al. | |

(Continued)

FOREIGN PATENT DOCUMENTS

EP 1 039 599 A2 9/2000

(Continued)

OTHER PUBLICATIONS

"Semiconductor Laser", Ohmsha, 1st edition, pp. 238, Oct. 25, 1994, Kenichi IGA; with partial translation.

*Primary Examiner*—Minsun Harvey
*Assistant Examiner*—Marcia A. Golub
(74) *Attorney, Agent, or Firm*—Hamre, Schumann, Mueller & Larson, P.C.

(57) ABSTRACT

A semiconductor laser device of the present invention includes: a first conductivity type cladding layer; an active layer; and a second conductivity type cladding layer, which are on a substrate. The semiconductor laser device further includes a stripe structure for injecting carriers therein. A width of the stripe is wider at a front end face of a resonator from which laser light is emitted than at a rear end face that is located on an opposite side of the front end face, and a reflectance of the front end face is lower than a reflectance of the rear end face. With this configuration, the injection of carriers into an active layer can be controlled in accordance with an optical intensity distribution along the resonator direction within the semiconductor laser, thus achieving a decrease in threshold current, an enhancement of a slope efficiency and an enhancement of a kink level. As a result, the semiconductor laser device can be provided so that stable laser oscillation in the fundamental transverse mode can be realized up to the time of a high optical output operation.

7 Claims, 5 Drawing Sheets

U.S. PATENT DOCUMENTS

| | | | |
|---|---|---|---|
| 6,516,159 B1 | 2/2003 | Tsunoda | |
| 6,567,446 B1* | 5/2003 | Huang et al. | 372/46.01 |
| 6,928,097 B2* | 8/2005 | Chida | 372/46.01 |
| 2002/0037021 A1* | 3/2002 | Ohkubo | 372/46 |
| 2003/0031222 A1* | 2/2003 | Balsamo et al. | 372/46 |
| 2003/0128729 A1* | 7/2003 | Matsumura | 372/46 |
| 2004/0008746 A1* | 1/2004 | Schmidt et al. | 372/46 |
| 2005/0163181 A1* | 7/2005 | Takayama | 372/46 |

FOREIGN PATENT DOCUMENTS

| | | |
|---|---|---|
| JP | 8-340147 | 12/1996 |
| JP | 9-307181 | 11/1997 |
| JP | 2000-357842 | 12/2002 |
| JP | 2000-066046 | 3/2003 |
| JP | 2003-101139 | 4/2003 |
| JP | 2004-235396 | 8/2004 |

\* cited by examiner

SEMICONDUCTOR LASER

BACKGROUND OF THE INVENTION

1. Field of the Invention

The present invention relates to a semiconductor laser device that operates stably and with high power, and particularly relates to a semiconductor laser device using a Group III-V nitride based semiconductor material.

2. Related Background Art

A semiconductor laser made of a Group III-V nitride based semiconductor material ($Al_xGa_yIn_{1-x-y}N$, where $0 \leq x \leq 1$, $0 \leq y \leq 1$) including gallium nitride is a key device for realizing ultra high-density recording using an optical disc, and is a violet semiconductor laser that is currently the nearest to a practical level. To increase the power of this violet semiconductor laser is a technology for allowing speedy writing with respect to an optical disc as well as a must technology for developing new technical fields such as the application to a laser display.

FIG. 7 schematically shows one example of a typical semiconductor laser in which a current confinement structure is formed with an insulation film. A stripe structure having a p-type conductive clad functions as a current confinement structure. Generally, a width of the stripe is uniform over the entire resonator. As a current injected from an electrode increases, a carrier density in an active layer increases, and when the value reaches a predetermined threshold carrier density, laser oscillation is attained. An optical output of the laser increases in proportion to the carrier density in the active layer. On the other hand, when the carrier density within the active layer is too high, a kink occurs due to spatial hole burning or a saturation of the optical output occurs due to a gain saturation, which impair the high optical output operation.

One of the effective measures for suppressing the generation of a kink is to narrow a width of a stripe. As a width of a ridge portion decreases, the distribution of carriers injected into an active layer and the expansion of an intensity distribution of light induced in the active layer in a transverse direction are narrowed relatively, thus suppressing the generation of a kink resulting from the spatial hole burning.

However, the narrowing of the width of the stripe uniformly over the entire resonator leads to an increase in series resistance of the device, which means an increase in driving voltage of the device. Especially, it is known that the reliability of a nitride based semiconductor laser critically depends on the driving voltage and a driving current, so that an increase in driving voltage should be suppressed to the minimum. Furthermore, a horizontal far-field of view, which is an important parameter of a semiconductor laser used for writing to an optical disc, also is determined by the width of the stripe. That is to say, the width of the ridge portion should be a value that can optimize each value of the current vs. optical output characteristics, the series resistance and the horizontal far-field of view of the device.

To cope with these challenges, JP 2000-357842 A discloses a laser structure in which a width of a stripe decreases toward both end faces of a resonator from a center portion of the resonator so as to form tapered regions. This structure can provide stable laser oscillation in a fundamental transverse mode without excessively increasing a driving voltage of the device, as compared with the conventional laser structure in which the width of the strip is narrowed uniformly.

In addition, "Semiconductor Laser" (written and edited by Kenichi IGA, published by Ohmsha, the $1^{st}$ edition, Oct. 25, 1994, p. 238) describes, as an effective method for increasing an output of a semiconductor laser, to let the end faces of a resonator have asymmetry in reflectance. This is a general method in a semiconductor laser that is used for writing to an optical disc. According to this method, the end faces forming the resonator are coated with dielectric films so as to let the end faces have asymmetry in reflectance, where among the end faces forming the resonator, a front end face of the resonator from which principal laser light is emitted is made to have low reflectance, whereas a rear end face on the opposite side is made to have a high reflectance. For instance, the front end face has the reflectance of 10%, and the rear end face has 90%. The reflectance of a dielectric multilayer film can be controlled by a refractive index and a thickness of a dielectric layer used and the total number of the lamination.

However, in the case where the front end face and the rear end face making up the resonator have asymmetry in reflectance, a significant deviation occurs in the distribution of an optical intensity along an axis direction of the resonator within a semiconductor laser. FIG. 9 shows one example of the optical intensity distribution along the axis direction of the resonator in the conventional semiconductor laser shown in FIG. 7. As shown by curve A of FIG. 9, when the front end face and the rear end face both have the reflectance of 20%, the front end face and the rear end face are the same in optical intensity. On the other hand, as shown by curve B of FIG. 9, when the reflectance of the front end face is 10% and the reflectance of the rear end face is 90%, the optical intensity at the front end face is higher than the optical intensity at the rear end face by about two times.

On the other hand, in the conventional type laser structure shown in FIG. 7, in which the width of the stripe is constant over the entire resonator, a density of carriers injected into the active layer is uniform along the axis direction of the resonator as shown by curve C of FIG. 8. Thus, in the semiconductor laser to which coating is applied so as to make the front end face and the rear end face have asymmetry in reflectance, a situation occurs such that, while there is a significant deviation occurring in the optical intensity distribution between the front end face and the rear end face, the density of carriers injected into the active layer is uniform. That is to say, the carrier density in the active layer in the vicinity of the rear end face becomes excessive, which leads to a problem of the generation of a kink or gain saturation.

This phenomenon becomes remarkable especially in a nitride based semiconductor laser having an extremely high threshold carrier density and having a high differential gain, as compared with an infrared semiconductor laser made of an AlGaAs based semiconductor material ($Al_xGa_{1-x}As$ ($0 \leq x \leq 1$)) and an infrared semiconductor laser made of an AlGaInP based semiconductor material ($Al_xGa_yIn_{1-x-y}P$ ($0 \leq x \leq 1$, $0 \leq y \leq 1$)).

According to the nitride based semiconductor laser structure disclosed in JP 2000-357842 A, the stabilization of the fundamental transverse mode is sought by decreasing the width of the stripe toward the front end face and the rear end face of the resonator from the central portion of the resonator. However, in the case where the front end face and the rear end face of the resonator are significantly different in reflectance, the above-stated structure cannot correct the unbalanced state of the optical intensity distribution and the density distribution of the injected carriers between the front end face and the rear end face, so that it is difficult to avoid the formation of a region having an excessive density of carriers injected.

SUMMARY OF THE INVENTION

Therefore, with the foregoing in mind, it is an object of the present invention to provide a semiconductor laser device, by which laser oscillation can be achieved in a stable fundamental transverse mode, a high-power laser can be obtained and a time duration for writing to an optical disc, etc, can be shortened.

The semiconductor laser device of the present invention includes: a first conductivity type cladding layer; an active layer; and a second conductivity type cladding layer, which are on a substrate. The semiconductor laser device further includes a stripe structure for injecting carriers therein. A width of the stripe is wider at a front end face of a resonator from which laser light is emitted than at a rear end face that is located on an opposite side of the front end face, and a reflectance of the front end face is lower than a reflectance of the rear end face.

DETAILED DESCRIPTION OF THE INVENTION

Figure 1:
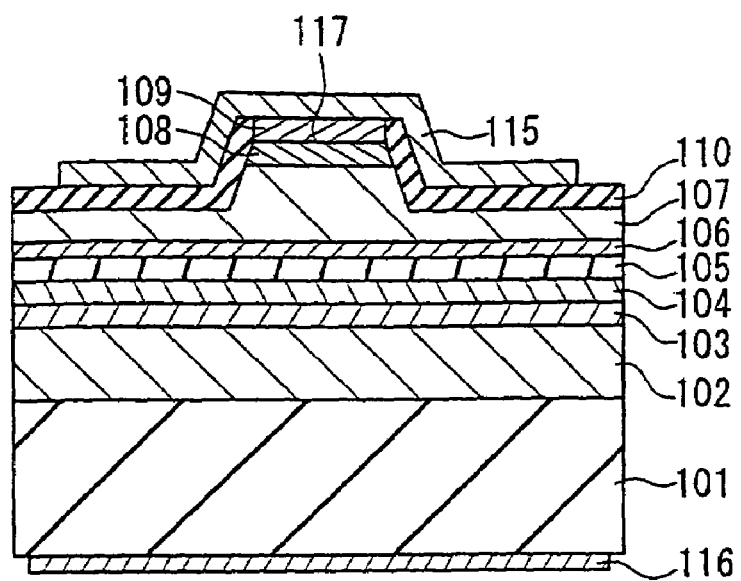
FIG. 1 is a cross-sectional view of one example of a semiconductor laser according to the embodiment of the present invention, taken along a direction perpendicular to a resonator of the device.

The semiconductor laser device of the present invention has a stripe structure on a substrate for injecting carriers therein, where a width of the stripe is wider at a front end face of a resonator from which laser light is emitted than at a rear end face that is located on an opposite side of the front end face, and a reflectance of the front end face is lower than a reflectance of the rear end face. With this configuration, the injection of carriers into an active layer can be controlled in accordance with an optical intensity distribution along the resonator direction within the semiconductor laser, thus achieving a decrease in threshold current, an enhancement of a slope efficiency and an enhancement of a kink level. As a result, the semiconductor laser device can be provided so that stable laser oscillation in the fundamental transverse mode can be realized up to the time of a high optical output operation.

In the semiconductor laser device of the present invention, it is preferable that at least the active layer includes a Group III-V nitride based semiconductor material.

The active layer may include an AlGaInP based semiconductor material or an AlGaAs based semiconductor material.

According to the present invention, the injection of carriers into the active layer can be controlled in accordance with an optical intensity distribution along the resonator direction within the semiconductor laser. The laser structure of the present invention allows a larger amount of carriers to be injected into a position close to the front end face, as compared with the conventional structure having a constant width of a bottom of the ridge portion or the laser structure disclosed in JP 2000-357842 A, even in the case of the same injected current value. Conversely, a phenomenon of the carrier density in the active layer increasing excessively at a position closer to the rear end face can be alleviated. As a result of this, a slope efficiency can be enhanced, and a density of carriers injected can be decreased and a saturation level of the optical output can be enhanced. This effect of increasing the optical output by controlling the shape of the ridge portion is especially effective for a semiconductor laser device made of a Group III-V nitride based semiconductor material having a high threshold carrier density and having a high differential gain.

In the above semiconductor laser device, it is further preferable that a ratio between the stripe width at the front end face and the stripe width at the rear end face satisfies a relationship of 1<(the stripe width at the front end face)/(the stripe width at the rear end face)<2.

The above semiconductor laser device preferably has the width of the stripe decreasing continuously from the front end face toward the rear end face.

Alternatively, in the above semiconductor laser device, the stripe structure may have a region in which the width of the stripe varies continuously and a region in which the width of the stripe is constant, and the stripe width at a boundary between the respective regions may vary seamlessly.

Alternatively, in the above semiconductor laser device, the stripe structure may have regions adjacent to the front end face and the rear end face, the regions respectively extending inwardly from the front end face and the rear end face and each having a constant stripe width.

The following describes embodiments of the present invention, with reference to the drawings.

FIG. 1 is a cross-sectional view of a nitride based semiconductor laser device according to one embodiment of the present invention, taken along a direction perpendicular to a resonator. The semiconductor laser device shown in FIG. 1 includes: a n-type cladding layer 102 made of n-type AlGaN on a n-type GaN substrate 101; an optical guide layer 103 made of n-type GaN; an active layer 104 having a multi quantum well structure including InGaN; a cap layer 105 made of undoped GaN; an optical guide layer 106 made of p-type GaN; a p-type cladding layer 107 made of p-type AlGaN; a contact layer 108 made of p-type GaN; a p metal layer 109; an insulation layer 110; a p electrode 115 and a n electrode 116. The insulation film 110 covers a top face of the device except for a top face of a stripe structure 117 that is a convex portion in a trapezoidal form. On the top face of the device including the top face of the stripe structure 117, the p electrode 115 is formed. The p electrode 115 contacts with the p metal layer 109 only at the top face of the stripe structure 117. On a rear face of the n-type GaN substrate 101, the n electrode 116 is formed.

A method for manufacturing the above-stated laser device is as follows. On the n-type GaN substrate 101 (thickness: 400 μm), the n-type AlGaN cladding layer 102 (thickness: 1.2 μm), the n-type GaN optical guide layer 103 (thickness: 0.1 μm), the active layer 104 having the multi quantum well structure including InGaN (thickness of a well layer: 3 nm, thickness of a barrier layer: 7 nm, including 10 units where a well layer+a barrier layer form one unit, total thickness: 0.1 μm), the undoped GaN cap layer 105 (thickness: 0.03 μm), the p-type GaN optical guide layer 106 (thickness: 0.1 μm), the p-type AlGaN cladding layer 107 (thickness: 0.5 μm) and the p-type GaN contact layer 108 (thickness: 0.2 μm) were grown successively by a metal-organic chemical vapor deposition method (MOCVD method). Dry etching was then applied thereto so as to process the p-type AlGaN cladding layer 107 and the p-type GaN contact layer 108 into a ridge shape so as to form the stripe structure 117. Thereafter, a top face portion of the device was covered with the insulation film 110 (made of $Ta_2O_5$, thickness: 0.1 μm) so that the top face of the stripe structure 117 formed an opening, and the p metal layer 109 (made of Pd, thickness: 0.05 μm), the p electrode 115 (made of Ti/Pt/Au, total thickness: 0.3 μm) and the n electrode 116 (made of Mo/Ti/Au, total thickness: 0.3 μm) were formed successively.

In this embodiment, a resonator length of the device was 600 μm, a chip width was 400 μm and a thickness was 800 μm. End faces of the resonator of the device were covered with dielectric films so that a front end face from which laser light was emitted had the reflectance of 10% and a rear end face on the opposite side had the reflectance of 90%.

Figure 2:
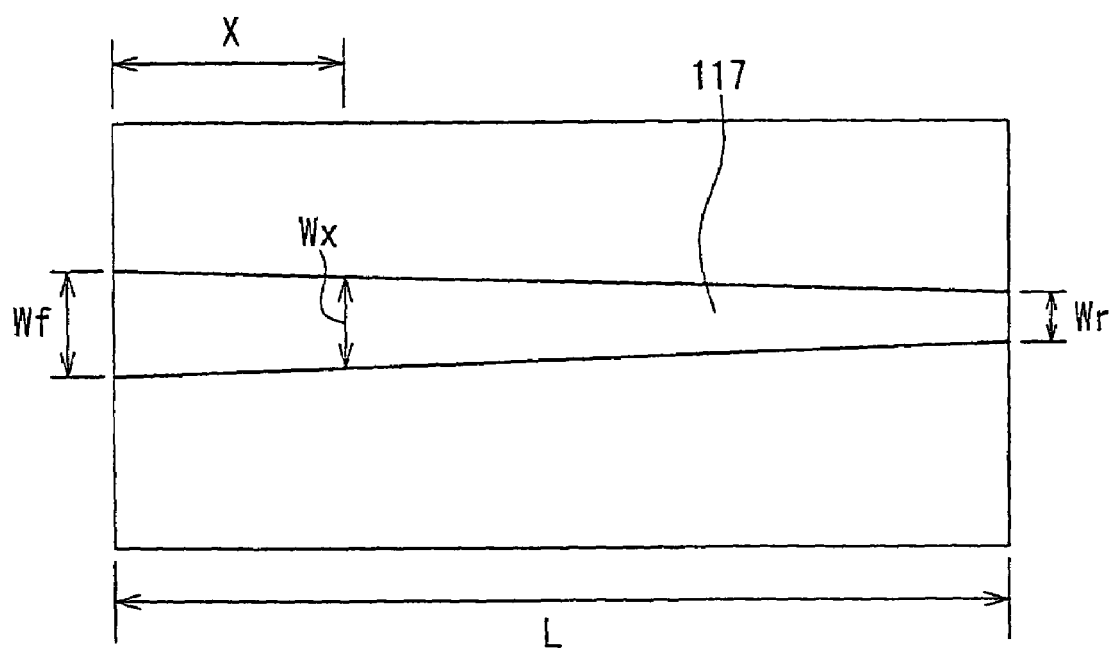
FIG. 2 is a top plan view of the semiconductor laser according to the embodiment of the present invention.

FIG. 2 is a top plan view of the nitride based semiconductor laser device according to this embodiment of the present invention, viewed from the above of the stripe structure 117. In FIG. 2, in order to clarify the shape of the stripe as the whole of the resonator, the insulation layer 110 and the p electrode 115 have been omitted.

Assuming a distance from the front end face is x, a width Wx of the stripe in the nitride based semiconductor laser device in this embodiment of the present invention was in accordance with the following formula (1):

$$Wx=Wf-[(Wf-Wr)\cdot x/L] \quad (1)$$

where Wf denotes a width of the stripe at the front end face, Wr denotes a width of the stripe at the rear end face and L denotes a resonator length. In this embodiment, the ridge width Wf at the front end face was 2.0 μm, and the ridge width Wr at the rear end face had six variations in total including: Sample No. 1: 1.4 μm; Sample No. 2: 1.6 μm; Sample No. 3: 1.8 μm; Sample No. 4 (Comparative Example): 2.0 μm; Sample No. 5 (Comparative Example): 2.2 μm; and Sample No. 6 (Comparative Example): 2.4 μm. The stripe structures were formed so as to be symmetric with respect to the direction of the emission of laser light.

Table 1 shows a relationship among the width of the stripe at the rear end face, a threshold current and a slope efficiency in the semiconductor lasers according to the embodiment of the present invention. Note here that the threshold currents and the slope efficiencies are values during a continuous oscillation operation, and the slope efficiencies are calculated from current vs. optical output characteristics at the time of output of 30 mW.

TABLE 1

| | Sample No. | | | | | |
|---|---|---|---|---|---|---|
| | 1 | 2 | 3 | 4* | 5* | 6* |
| Stripe Width at Rear End Face: Wr (μm) | 1.4 | 1.6 | 1.8 | 2.0 | 2.2 | 2.4 |
| Threshold Current (mA) | 29.3 | 33.2 | 36.3 | 38.7 | 39.9 | 40.3 |
| Slope Efficiency (W/A) | 1.49 | 1.35 | 1.28 | 1.18 | 1.15 | 1.12 |

Remark:
*denotes comparative examples.

Figure 7:
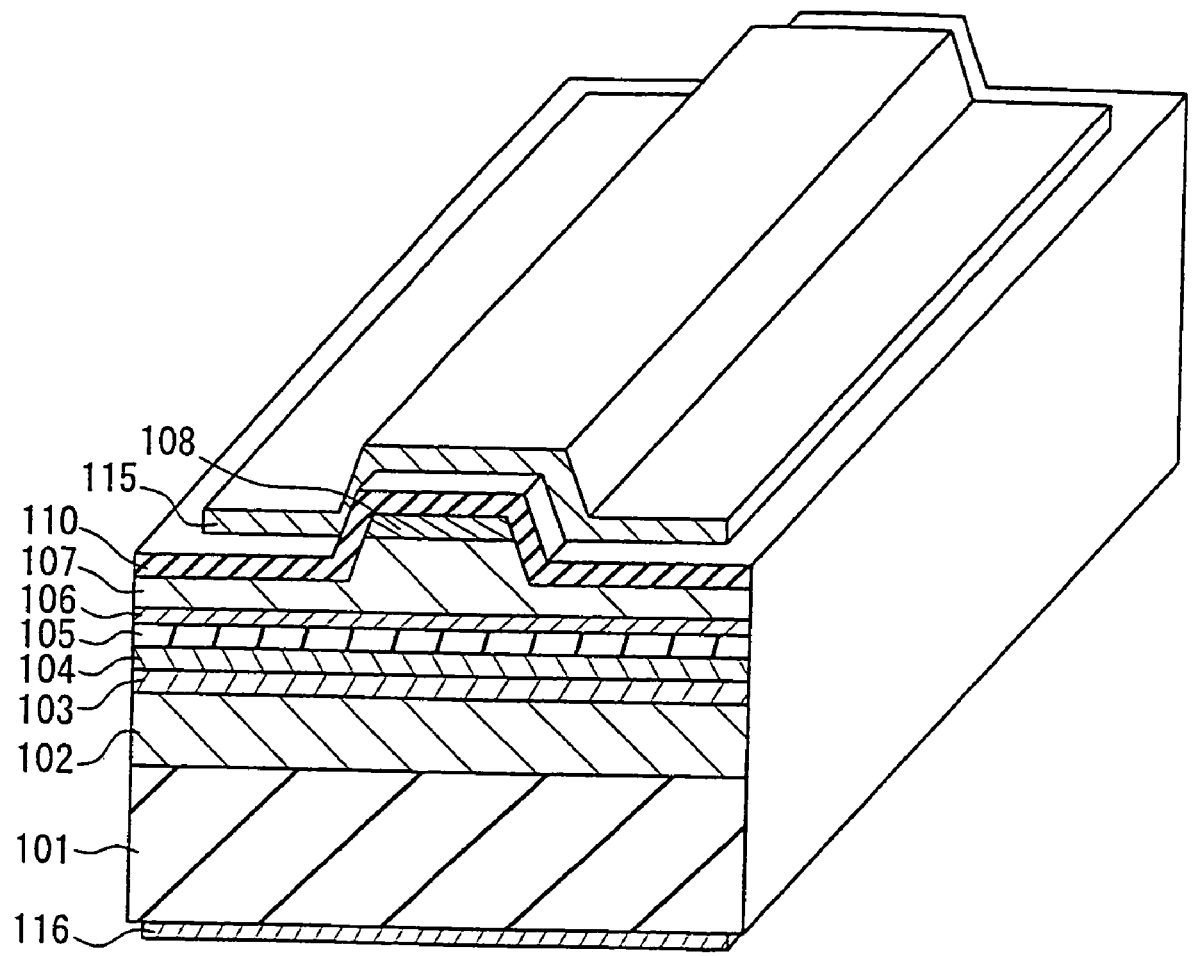
FIG. 7 schematically shows one example of a conventional semiconductor laser.

The laser structure shown with Sample No. 4 having the stripe width at the rear end face of 2.0 μm corresponds to the conventional laser structure shown in FIG. 7 (the width of the stripe is constant over the entire resonator). It was confirmed that as the width of the stripe at the rear end face became narrower, the slope efficiency increased.

Figure 5:
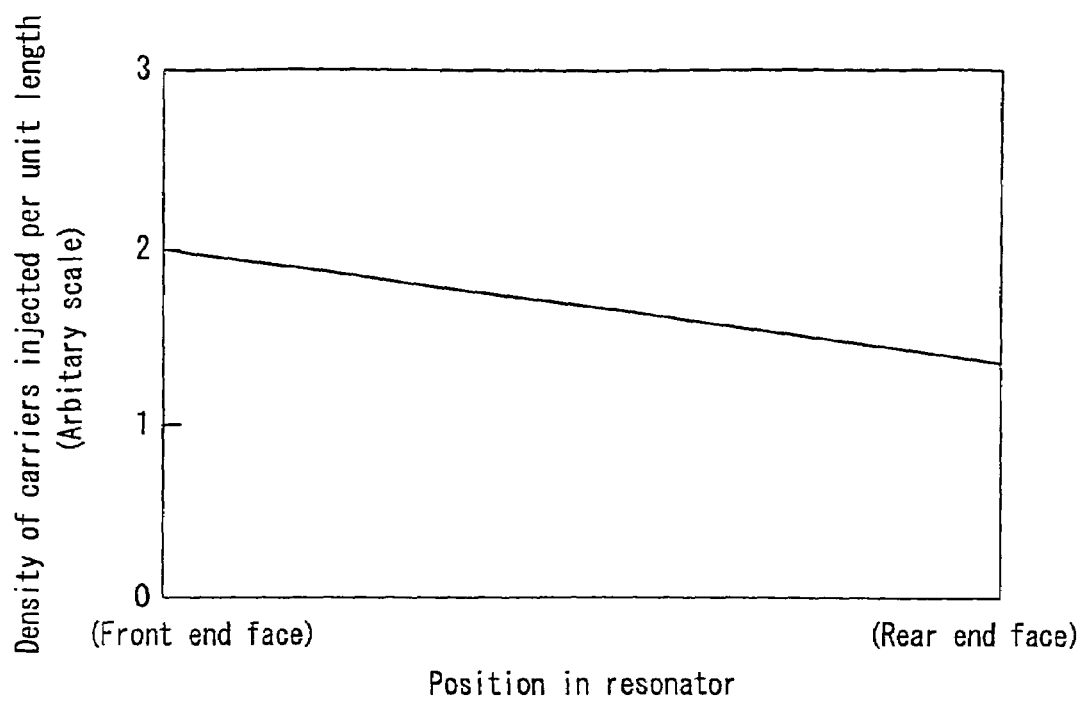
FIG. 5 is a graph showing one example of a density of carriers injected per unit length in the semiconductor laser according to the embodiment of the present invention.
Figure 6:
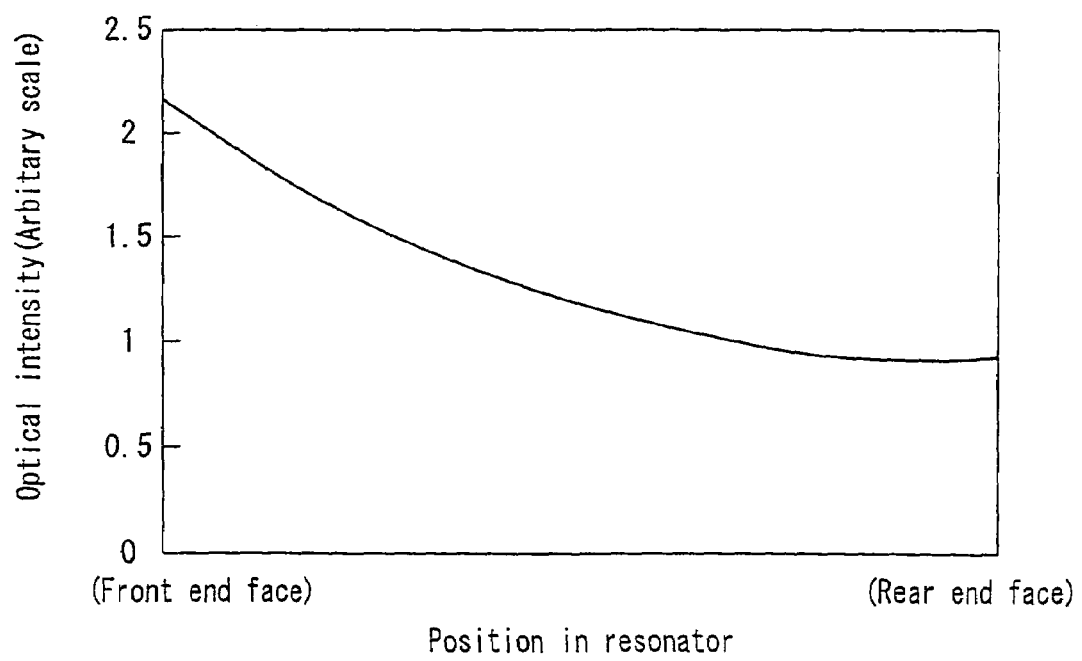
FIG. 6 is a graph showing one example of an optical intensity distribution in an axis direction of the resonator of the semiconductor laser according to the embodiment of the present invention.
Figure 9:
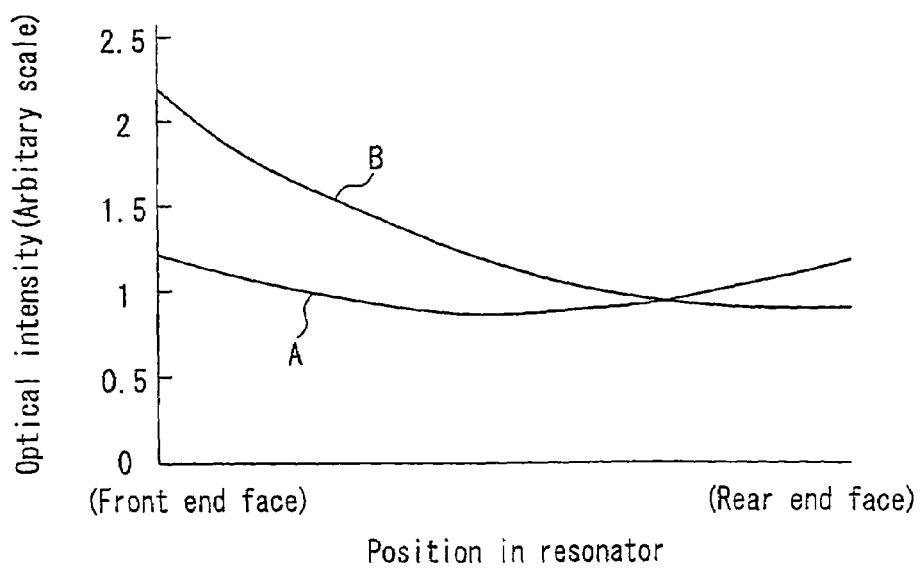
FIG. 9 is a graph showing an optical intensity distribution in an axis direction of the resonator of the conventional semiconductor laser shown in FIG. 7.

FIG. 5 is a graph of one example of a density of carriers injected per unit length of a resonator in the laser of this embodiment (Sample No. 1), and FIG. 6 is a graph of one example of an optical intensity distribution along the axis direction of the resonator of the same. The density of carriers injected per unit length and the optical intensity distribution along the axis direction both were high at the front end face and low at the rear end face, so as to keep a good balance. That is to say, in the laser of this embodiment, the width of the resonator becomes narrower toward the rear end face from the front end face, and therefore the density of carriers injected in the vicinity of the front end face could be made higher than that in the vicinity of the rear end face. In this laser, since the reflectance at the front end face is 10% and the reflectance at the rear end face is 90%, the optical intensity along the resonator length direction (FIG. 6) is the same as that shown by curve B of FIG. 9.

Figure 8:
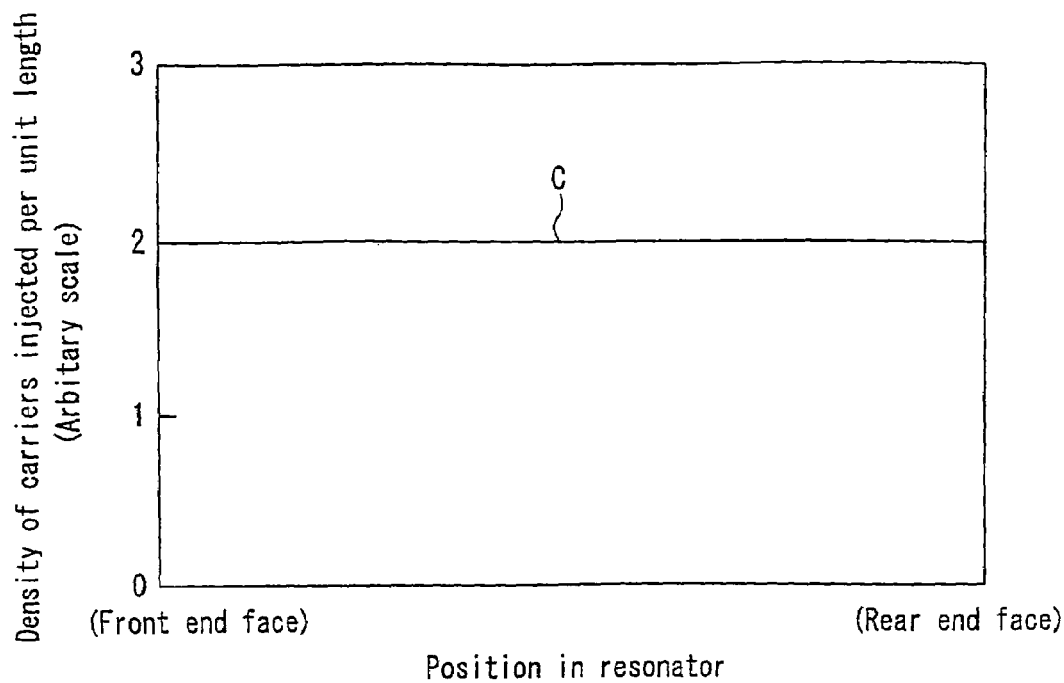
FIG. 8 is a graph showing a density of carriers injected per unit length in the conventional semiconductor laser.

On the contrary, in the conventional laser (Sample No. 4), since the width of the resonator was constant, a density of carriers injected per unit length (FIG. 8) became uniform along the axis direction of the resonator. Thus, the density of carriers injected per unit length and the optical intensity distribution along the axis direction lost their balance.

As stated above, by widening the width of the stripe at the front end face, from which the principal laser light is emitted, as in this embodiment, a larger amount of carriers could be injected into a region with a high optical intensity, whereby the balance within the active layer between the optical intensity distribution and the density distribution of injected carriers could be improved and a region with the excessive density of injected carriers could be reduced, so that an increase in gain could be attained. As a result, as shown in Table 1, the characteristics of the semiconductor laser device could be improved.

On the other hand, as is understood from Table 1, in the case where the width of the stripe is smaller on the front end face side than on the rear face side and the reflectance at the front end face is lower than that at the rear end face, a deterioration of the characteristics was found, such as an increase in threshold current and a decrease in slope efficiency. This results from a larger amount of carriers injected into a region with a low optical intensity because the stripe width at the rear end face was widened, thus promoting the unbalance between the optical intensity distribution and the density distribution of carriers injected within the active layer and causing a deterioration of the gain.

Furthermore, in the semiconductor laser device of this embodiment, a kink level and a characteristic temperature were improved significantly by controlling the shape of the stripe. In the conventional laser structure with the stripe width of 2.0 μm at the rear end face, the average kink level was 63 mW during a continuous oscillation operation.

On the other hand, in the laser structure with the stripe width of 1.4 μm at the rear end face, the average kink level was 105 mW during a continuous oscillation operation, and stable laser oscillation in the fundamental transverse mode could be realized up to the time of the high optical output operation. Also, a characteristic temperature was increased from 105 K to 145 K. As was evident from a decrease in threshold current, a thermally saturation level was improved due to a decrease in carrier density in the active layer.

These phenomena suggest that the laser structure of the present invention allows the injection of carriers into the active layer to be controlled in accordance with the optical intensity distribution along the resonator direction and the carriers injected into the active layer to be converted effectively into laser light.

One of the parameters required at the time of writing to an optical disc is a ratio between a vertical far-field of view and a horizontal far-field of view (aspect ratio). In terms of a capturing efficiency of light, it is desirable that the aspect ratio generally is 3 or less. The horizontal far-field of view is a value that critically depends on the width of the ridge. In the semiconductor laser according to this embodiment in which the width of the stripe varies along the direction of the resonator, the horizontal far-field of view can be controlled by the ridge width at the front end face from which laser light is emitted. Therefore, it is desirable that the ridge width at the front end face is determined so that a horizontal divergence angle can satisfy the specifications.

In the conventional laser structure in which the width of the stripe is constant over the entire resonator, the width of the stripe cannot be widened because a decrease in kink level should be avoided.

On the contrary, in the semiconductor laser of the present invention, since its kink level is improved, an allowable range of the ridge width can be increased. This is an excellent effect in terms of a design margin and a process margin. At the same time, an increase in series resistance of the device associated with the narrowing of the stripe width can be suppressed, and therefore a driving voltage of the device is not increased extremely.

However, in the case where the stripe width is different considerably between a portion near the front end face and a portion near the rear end face, there is a possibility of a scattering loss being increased. Thus, preferably, a ratio between the stripe width at the front end face and the stripe width at the rear end face is in the range of 1<(the stripe width at the front end face)/(the stripe width at the rear end face)<2. The more preferable range is 1.4<(the stripe width at the front end face)/(the stripe width at the rear end face)<1.8.

Figure 3:
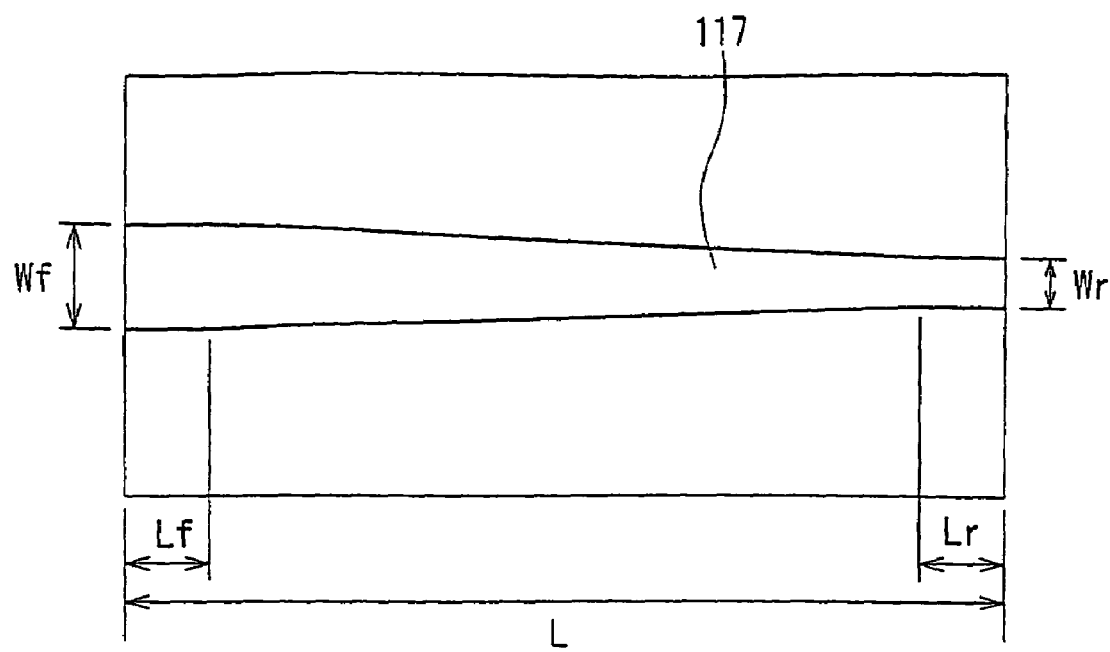
FIG. 3 is a top plan view showing a modification example of the semiconductor laser according to the embodiment of the present invention.

Note here that the semiconductor laser according to this embodiment shown in FIG. 2 can be modified as a structure shown in FIG. 3, for example. A feature of the structure shown in FIG. 3 resides in that there are regions inward by lengths Lf and Lr from a front end face and a rear end face of a resonator, respectively, in which the widths of the stripe are constant as Wf and Wr. As long as Lf and Lr are about one-twentieth or shorter of a length of the resonator, respectively, they have no effects on the current vs. optical output characteristics shown in Table 1.

Figure 4:
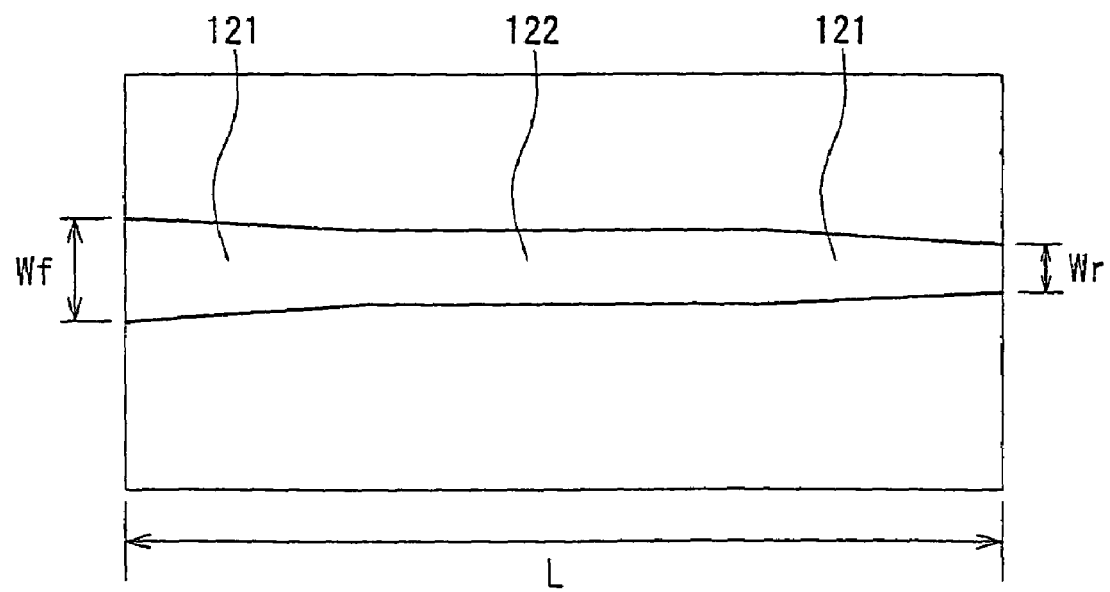
FIG. 4 is a top plan view showing another modification example of the semiconductor laser according to the embodiment of the present invention.

Furthermore, although this embodiment describes the case where the width of the stripe varies continuously from the front end face to the rear end face, the shape of the stripe is not limited to this. For instance, as shown in FIG. 4, another stripe structure is possible in which a plurality of regions are combined so as to include a region A 121 in which a stripe width decreases continuously from the front end face toward the rear end face and a region B 122 in which the stripe width is constant, from which the similar effects can be obtained.

Note here that although this embodiment shows the case where the reflectance of the front end face is 10% and the reflectance at the rear end face is 90%, the reflectance is not limited to this example as long as the reflectance of the front end face is lower than the reflectance of the rear end face. For instance, it is preferable that the reflectance of the front end face is lower than the reflectance of the rear end face by 15% or more. The preferable upper limit is less than 100%. If a difference in reflectance is larger, larger effects from the present invention can be obtained correspondingly.

In addition, laser light that is slightly emitted from the rear end face may be received by a light receiving element for the purpose of monitoring the output light of the laser.

Furthermore, the semiconductor laser of the present invention is not limited to the lamination structure shown in this embodiment. For instance, an etching stop layer may be provided immediately below the stripe structure, or a side face of the p-type cladding layer 107 that is processed into the stripe shape may be embedded with a semiconductor layer and the like.

Moreover, in this embodiment, the p-type cladding layer 107 and the contact layer 108 have the stripe structure. However, as long as at least the p-type cladding layer formed on the active layer has a stripe structure, the current confinement function can be provided.

Note here that although the semiconductor laser is formed on the GaN substrate in this embodiment, the substrate may be another one that allows a Group III-V nitride based semiconductor material to be epitaxially-grown thereon, e.g., a sapphire substrate and a SiC substrate.

In addition, although this embodiment shows the semiconductor laser made of a Group III-V nitride based semiconductor material, other lasers, e.g., semiconductor lasers made of an AlGaAs based semiconductor material and an AlGaAsP based semiconductor material, also enable a high-power semiconductor laser that can achieve laser oscillation in a stable fundamental transverse mode.

Especially, when the semiconductor laser made of an AlGaInP based semiconductor material is formed on a GaAs substrate whose plane orientation is tilted from a (100) direction to a [0-11] or [011] direction, there is no band gap fluctuation occurring due to the ordering of crystals, so that a stable high-power laser can be obtained.

Furthermore, although the semiconductor laser with a one stripe structure formed for each laser element is described herein, a multi-beam type semiconductor laser in which a plurality of stripes are formed for one laser element also is possible, from which the similar effects can be obtained. Moreover, even in a high-power semiconductor laser that does not necessarily require the laser oscillation only in the fundamental transverse mode, the gain saturation thereof can be alleviated by using the method of the present invention for controlling the density of injected carriers, whereby a still higher-power semiconductor laser can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor laser device, comprising:
    a first conductivity type cladding layer;
    an active layer; and
    a second conductivity type cladding layer, which are on a substrate,
    wherein the semiconductor laser device further comprises a stripe structure for injecting carriers therein,
    a width of the stripe is wider at a front end face of a resonator from which laser light is emitted than at a rear end face that is located on an opposite side of the front end face,
    a reflectance of the front end face is lower than a reflectance of the rear end face,
    a ratio between the stripe width at the front end face and the stripe width at the rear end face satisfies a relationship of 1<(the stripe width at the front end face)/(the stripe width at the rear end face)<2,
    the stripe structure has regions adjacent to the front end face and the rear end face, the regions respectively extending inwardly from the front end face and the rear end face and each having a constant swipe width,
    the region having the constant stripe width on the front end face side has a length of one-twentieth or shorter of a length of the resonator, and the region having the constant stripe width on the rear end face side has a length of one-twentieth or shorter of the length of the resonator, and
    the stripe width at the rear end face is 1.4 µm or more and less than 2.0 µm.

2. The semiconductor laser device according to claim 1, wherein at least the active layer comprises a Group III-V nitride based semiconductor material.

3. The semiconductor laser device according to claim 1, wherein at least the active layer comprises an AlGaAs based semiconductor material.

4. The semiconductor laser device according to claim 1, wherein at least the active layer comprises an AlGaInP based semiconductor material.

5. The scruiconductor laser device according to claim 1, wherein the ratio between the stripe width at the front end face and the stripe width at the rear end face satisfies a relationship of 1.4<(the stripe width at the front end face)/(the stripe width at the rear end face)<1.8.

6. The semiconductor laser device according to claim 1, wherein the reflectance of the front end face is lower than the reflectance of the rear end face by 15% or more.

7. The semiconductor laser device according to claim 1, wherein the semiconductor laser device is used for writing to an optical disk.

* * * * *